United States Patent [19]

Laviron

[11] Patent Number: 4,677,628

[45] Date of Patent: Jun. 30, 1987

[54] GENERATOR OF PREDETERMINED SEQUENCES OF COMBINED LOGIC SIGNALS

[75] Inventor: André Laviron, Fontaine les Dijon, France

[73] Assignee: Commissariat a l'Energie Atomique, Paris, France

[21] Appl. No.: 746,307

[22] Filed: Jun. 19, 1985

[30] Foreign Application Priority Data

Jul. 3, 1984 [FR] France ............................. 84 10515

[51] Int. Cl.⁴ .............................................. G06F 11/00
[52] U.S. Cl. ........................................ 371/57; 371/52; 371/29
[58] Field of Search .......................... 371/52, 57, 29; 364/900

[56] References Cited

U.S. PATENT DOCUMENTS

| | | | |
|---|---|---|---|
| 3,688,261 | 8/1972 | Henderson | 371/52 |
| 3,812,337 | 5/1974 | Crosley | 371/57 |
| 4,059,749 | 11/1977 | Feilchenfeld | 371/57 |

Primary Examiner—Charles E. Atkinson
Attorney, Agent, or Firm—Oblon, Fisher, Spivak, McClelland & Maier

[57] ABSTRACT

The invention relates to a generator of predetermined sequences of combined logic signals. This generator is characterized in that it comprises sequential means having outputs (EVEN1 ... EVENR) supplying at each instant $t_i$ of a succession of instants of each sequence, a number $q_i$ of logic level 1 signals and a number $R-q_i$ of logic level 0 signals, the sum of the numbers $q_i$ being equal to a predetermined number p, means (CH1, VAL-COL) connected to the sequential means for initializing and supplying the signal corresponding to the sequence, controlled means connected to the sequential means so that the latter supply at instants $t_i$ the $q_i$ logic level 1 signals and the $R-q_i$ logic level 0 signals, so that the sum of the numbers $q_i$ is equal to p, and stop means connected to the sequential means for stopping the supply of signals on the R outputs, following a predetermined sequence of combined signals.

9 Claims, 4 Drawing Figures

GENERATOR OF PREDETERMINED SEQUENCES OF COMBINED LOGIC SIGNALS

BACKGROUND OF THE INVENTION

The present invention relates to a generator of predetermined sequences of combined logic signals.

This generator makes it possible to obtain predetermined sequences of combined logic signals of levels 1 and 0 obtained, in certain predetermined circumstances, at successive instants of each sequence.

The invention is applicable to the simulation of all logic systems operating on the basis of the reception of logic signals of level 0 or 1 which, when applied to the different inputs of a simulation circuit, correspond to the simulation of the failure or repair of components of the simulated circuit. This generator can also be used in the study of the failure or satisfactory operation of any system having a plurality of components (e.g. mechanical or hydraulic), as a function of the failure or satisfactory operation of each of these components. The failure or satisfactory operation of the components of the system can take place either simultaneously or separately. The study of the failure of the system takes place by associating the generator according to the invention with a logic simulator, whose logic components represent the components of the simulated system. The logic signals of level 0 or 1 are applied to the inputs of logic components of the simulator in order to simulate the failure or repair of corresponding components of the system. For each of the combinations of the logic signals supplied to the outputs of the generator according to the invention, the response of the simulator (logic level of the output signal thereof) is analysed, to establish whether it is a combination of logic signals which will or will not lead to the failure of the system. The list of combinations of the logic signals of level 0 or 1 associated with the simulator responses makes it possible to analyze the simulated system for reliability studies.

It is known that in nuclear power stations, aircraft, oil industry research means, etc., it is necessary to use control or security systems having a high degree of reliability and which for this reason very frequently have redundant channels. These redundant channels make it possible to ensure that any failure of one of the components of one of the channels does not prevent the system from triggering the desired security or control action. These redundant channels also make it possible to facilitate the repair or inspection of one of the channels without stopping the desired security or control action.

Different methods have been used for analyzing the reliability of control or security systems. Unfortunately, these methods generally use the so-called failure tree principle, which requires the use of a power computer, when the system to be checked is complex. These difficulties are described in the article by P. K. ANDOW entitled "Difficulties in fault tree synthesis for process plant", which appeared in the IEEE Transactions reliability journal, Vols R29, April 1980, pp. 2 to 9.

The difficulties appearing in the reliability analysis of the system on the basis of the failure tree thereof can be surmounted by the use of wired simulation circuits representing the system. These circuits are e.g. described in the article entitled "Verification of fault tree analysis" published by "Electric Power Research Institute", in the Journal EPRI-NP-1570, Vols 1 and 2, May 1981. These simulation circuits make it possible to avoid the design of a failure tree of a system, but have very limited performance levels, because they permit the reliability study of systems having at the most 20 components.

More recently, a combined logic signal generator has been developed, which makes it possible to study the reliability of systems on the basis of simulation circuits. This generator is described in the article by A. LAVIRON entitled "ESCAF-failure simulation and reliability calculation device", Second National Reliability Conference, Birmingham, England, Vol. 2, March 1979, pp. 6C/4/1-6C/4/10. This combined logic signal generator makes it possible to study the reliability for complex systems via logic simulators. On N of its outputs, it supplies all the possible combinations of P logic signals of level 1 and N-P logic signals of level 0. As a function of the sought reliability tests, these logic signals are applied to the inputs of components of the simulation circuit, so as to simulate either the satisfactory operation of each component (logic level 1 of the signal applied to one input of the component), or the failure of each component (logic level 0 applied to the input of said component). These logic signals simulating the failure or satisfactory operation of one or more components of the simulation circuit make it possible to observe on the output of said circuit whether the failure or satisfactory operation of one or more components of the circuit leads to the failure or satisfactory operation of the said circuit. The aforementioned combination generator makes it possible to simulate systems with more than 400 components. However, it only permits the simulation of events (failure or satisfactory operation of components of a circuit) which occur simultaneously for studies in which there is no intervention of the arrival order of the events. This generator, which clearly constitutes an advance compared with simulation systems using power computers (e.g. of the GRAY I type) still does not make it possible to simulate events (failure or satisfactory operation of the components of a circuit occurring in a successive manner). However, it is often necessary in a reliability study of a system to bring about the intervention of failure or satisfactory operation sequences, in which the arrival order of the events has a considerable importance for the reliability study. The simulation procedures (failure tree) used with the aforementioned generator cannot then be used. These known procedures require the preparation of a MARKOV diagram which is generally very complex and cannot in fact be provided for a system having numerous components.

SUMMARY OF THE INVENTION

The object of the present invention is to obviate the disadvantages of the known means making it possible to study the reliability of complex systems. It in particular makes it possible to surmount the disadvantages relating to performance limitations, costs and the complexity of known means, particularly those using power computers. The generator according to the invention makes it possible to apply sequentially occurring events to the investigated systems. It also makes it possible to improve the performances of the aforementioned combination generator, particularly by making it possible to study the reliability of highly complex systems. These systems are in particular those involving sequential events with special conditions which do or do not validate certain events at certain periods of the sequence, e.g. it is only possible to simulate the refusal of an engine to start at the time when the engine effectively receives a start instruction. As a result of a simulation circuit, the sequential generator according to the invention makes it possible to study most systems requiring a reliability study.

The invention therefore specifically relates to a generator of predetermined sequences of combined logic signals, wherein it comprises sequential means incorporating a number R of outputs able to supply at each instant $t_i$ of a succession of instants of each predetermined sequence of combined signals, a number $q_i$ of signals of logic level 1 supplied on $q_i$ outputs and a number $R-q_i$ of signals of logic level 0 supplied on $R-q_i$ outputs, the sum of the numbers $q_i$ being equal to a predetermined number p of signals of logic level 1, means connected to the sequential means for initializing them and in order that they supply the signals of logic levels 1 and 0 at the successive times $t_i$ corresponding to the predetermined sequence on the basis of the recorded initial combination, control means connected to the sequential means so that the latter supply at instants $t_i$ on R outputs, the $q_i$ signals of logic level 1 and the $R-q_i$ signals of logic level 0, so that the sum of the numbers $q_i$ is equal to p for all the instant $t_i$ in the sequence, the numbers R, $q_i$ and p being integers and stop means connected to the sequential means for stopping the supply of signals on the R outputs following a predetermined sequence of combined signals.

According to another feature, the sequential means are sequential multiplexing means able to record said initial combinations for supplying on R outputs, the $q_i$ signals of logic level 1 and the $R-q_i$ signals of logic level 0, each initial combination having p signals of logic level 1 and signals of logic level 0.

According to another feature, the sequential multiplexing means comprise a combined logic signal generator having N outputs able to supply said initial combinations, corresponding to said predetermined sequences, each initial combination being formed from p signals of logic level 1 produced on p outputs of the combined signal generator and N-p signals of logic level 0 produced on N-p outputs of the combined signal generator and multiplexers receiving on N inputs the p signals of logic level 1 and the N-p signals of logic level 0, corresponding to the initial combinations and supplying on R outputs, the $q_i$ signals of logic level 1 and the $R-q_i$ signals of logic level 0 at the successive instants $t_i$ of each sequence, the initialization means being connected to the combined signal generator, the control means being connected to the combined signal generator and to the multiplexers.

According to another feature, the number of successive instants $t_i$ varies from 1 to m, m being an integer equal to or lower than p, whilst $q_i$ is an integral value between 1 and p.

According to another feature, the generator also comprises logic checking means connected to the R outputs of the multiplexers and to the control means having means for aborting any sequence for which, at any instant $t_i$, two output signals from among the R output signals of the multiplexers are simultaneously at logic level 1 when they should not be.

According to another feature, the checking means C have means for aborting any sequence for which, at any instant $t_i$, no signal of logic level 1 is supplied to any random 1 of the R outputs of the multiplexers at an instant $t_i$ of a sequence, whereas signals of logic level 1 are supplied at an instant $t_i+k$, with $k \geq 1$.

According to another feature, the logic checking means incorporates an input for the control of the invalidation by control means of an initial combination of logic signals present on the N outputs of the combined logic signal generator.

According to another feature, the logic checking means (C) also incorporate an input (EVENEXT) and an input (INHIB) for the control of bringing to logic level 0 of the output signals of the multiplexers, when at an instant $t_i$ the sequence of signals provided at this instant on the outputs of the multiplexers must not be used.

According to another feature, the checking means (C) incorporate means for the recording of signals (VALCOL), which, combined with the signal supplied on the R outputs of the multiplexers (MX1, ... MXR) make it possible to invalidate any sequence not corresponding to a desired signal sequence on the outputs of the multiplexers.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

The generator of predetermined sequences of logic signals according to the invention is more particularly intended for the study of the failure or satisfactory operation of a logic signal but, as will be seen, it also makes it possible, by analogy, using a logic simulation circuit, to study the satisfactory operation or failure or miscellaneous systems, such as e.g. hydraulic circuits.

Figure 1:
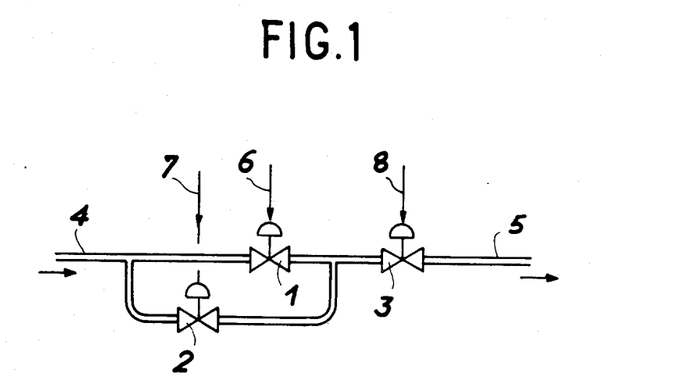
FIG. 1 diagrammatically, a system whose reliability can be studied by means of the generator according to the invention.

FIG. 1 diagrammatically shows a hydraulic circuit, whose reliability can be studied by means of the generator according to the invention, via a simulation circuit which will be described in greater detail hereinafter. For example, this hydraulic circuit makes it possible to establish the circulation of a fluid between an upstream pipe 4 and a downstream pipe 5, as a result of three pneumatic valves 1, 2, 3, whose opening or closure can be controlled by the presence or absence of compressed air in control pipes 6, 7, 8. In this circuit, it is considered that the valves constitute the only components which can be either in a failure state, or in a satisfactory operation state. The hydraulics circuit in question is defective if the fluid is not transferred into the downstream pipe 5. If only valves 1 and 2 are defective, the fluid no longer passes from the upstream pipe 4 to the downstream pipe 5. The same is the case when valves 1 and 3 are defective. In both cases, the circuit is brought into the failure state, when the aforementioned valves are defective. When only valves 1 and 3 operate satisfactorily, the fluid passes from the upstream pipe to the downstream pipe, so that the circuit remains in a satisfactory operation state when only valves 1 and 3 are operating satisfactorily.

Figure 2:
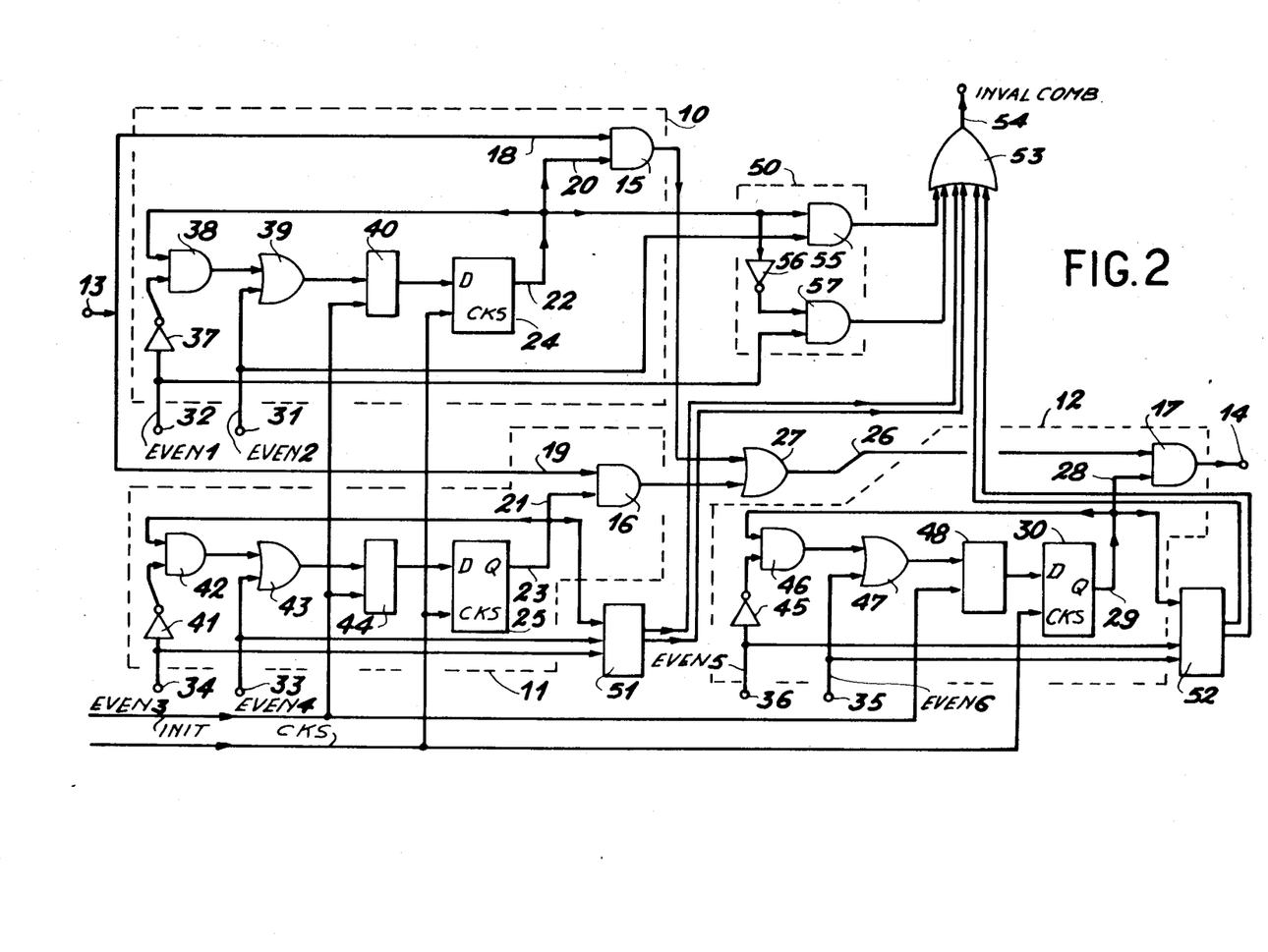
FIG. 2 diagrammatically, a circuit for simulating the system of FIG. 1.

FIG. 2 diagrammatically shows an equivalent logic circuit making it possible to simulate the hydraulic circuit of FIG. 1. As will be shown hereinafter, it is to the inputs of some of the components of this circuit that are applied the sequences of signals supplied by the combined logic signal sequence generator according to the invention. These sequential signals of logic level 0 or 1, applied to inputs of some of the components of the simulation circuit, make it possible to electronically simulate either the failure, or the satisfactory operation of corresponding components of the hydraulics system. In the diagram of FIG. 2, assemblies 10, 11, 12 of logic circuits make it possible to simulate either the failure, or the satisfactory operation of valves 1, 2, 3 of FIG. 1. These assemblies of logic circuits are constituted in such a way that if a signal of logic level 1 is applied to an input 13 of the simulation circuit, a signal of logic level 1 must appear at the output 14 of said circuit. Said logic level 1 signal applied to the input in fact simulates the arrival of the fluids in pipe 4, upstream of the hydraulics system of FIG. 1. At output 14 of the simulation circuit, said logic level 1 signal makes it possible to deduce that the simulated system is in a satisfactory operating state and that it permits the passage of the fluid arriving at its inlet, no matter what the failure or satisfactory operational state of one or more of the components of the simulated hydraulics circuit.

The logic simulation assemblies 10, 11, 12 respectively comprise logic AND gates 15, 16, 17, each of which has two inputs. The inputs 18, 19 of gates 15, 16 receive the logic level 1 signal applied to the circuit input 13, for simulating the arrival of fluid in pipe 4 with respect to the circuit of FIG. 1. The other inputs 20, 21 of gates 15, 16 are respectively connected to outputs 22, 23 of memory 24, 25 constituted by D flip-flops. Gates 15, 16 supply a logic level 1 signal to their output when the D flip-flops 24, 25 connected to their inputs 20, 21 supply a logic level 1 signal to their Q outputs 22, 23. Conversely, these gates supply a logic level 0 signal when the D flip-flops supply a logic level zero signal. Thus, the logic level 1 of the signal supplied by the D flip-flops represents the satisfactory operation of the corresponding valve of the simulated system. The logic level 0 of said signal represents the failure or unsatisfactory operation of said valve.

In the same way, AND gate 17 of logic assembly 12 corresponding to the valve of the hydraulic circuit of FIG. 1 comprises an input 26 connected to the output of an OR gate 27, which has two inputs respectively connected to the outputs of AND gates 15, 16. It is equivalent to the connection of valve 3 to the outlets of valves 1 and 2 of the hydraulic circuit. The other input 28 of AND gate 17 is connected to the output 29 of a memory 30, which is also formed by a D flip-flop. As hereinbefore, the presence of a logic level 1 signal on output 29 of flip-flop 30 expresses the satisfactory operation of the corresponding valve 3 of the simulated hydraulic circuit. However, the presence of a logic level 0 signal on output 29 expresses the unsatisfactory operation or failure of valve 3.

A logic level 1 signal is obtained on output 22 of flip-flop 24 and simulates the satisfactory operation of the corresponding valve 1, when a signal EVEN2 of logic level 1 is applied to the input 31 of simulation assembly 10 at the same time as a clock signal CKS is applied to flip-flop 24. A logic level 1 signal is obviously applied to the simulation circuit input 23. A logic level 0 signal is obtained on output 22 of flip-flop 24 and simulates the failure of valve 1, when a EVEN1 signal of logic level 1 is applied to input 32 of assembly 10, at the same time as a clock signal CKS is applied to flip-flop 24.

In the same way, the simulation assemblies 11, 12 respectively comprise inputs 33, 34 and 35, 36. EVEN4 and EVEN6 signals of logic level 1 respectively applied to inputs 33, 35 simulate the satisfactory operation of the corresponding components 2, 3 of the hydraulic circuit. The EVEN3 EVEN5 signals of logic level 1 respectively applied to inputs 34, 35 simulate the failure of the corresponding components 2, 3 of the hydraulic circuit. Clock signals CKS are respectively applied to flip-flops 25, 30.

In assembly 10, the EVEN1 signal of logic level 1, simulating the failure of valve 1, is applied to an inverter 37, whose output is connected to an input of and AND gate 38. Another input of this gate is connected to the output 22 of flip-flop 24. The output of the AND gate 38 is connected to one input of an OR gate 39, whereof another input receives the EVEN2 signal of logic level 1, when the satisfactory operation of valve 1 has to be simulated. The output of the OR gate 39 is connected to an input of a multiplexer 40. Another input of this multiplexer receives on initialization, an INIT signal from the sequence generator according to the invention, as will be shown in greater detail hereinafter. The output of multiplexer 40 is connected to the D input of flip-flop 24. Another input of said flip-flop receives the clock signal CKS from the combined logic signal sequence generator according to the invention.

In the same way, simulation assembly 11 comprises an inverter 41, another AND gate 42, an OR gate 43, a multiplexer 44, whilst simulation assembly 12 also comprises an inverter 45, another AND gate 46, an OR gate 47 and a multiplexer 48. These elements are connected in the same way as in assembly 10.

It can be seen that in the simulation circuit described hereinbefore, the logic level of the signal on the output 14 of said circuit is dependent on the logic level of the sequential signals EVEN1, EVEN2, EVEN3, EVEN6, applied to the corresponding simulation inputs of said circuit by the sequence generator according to the invention. The operation of this simulation circuit will now be described in greater detail.

At the start of a sequence of combined logic signals applied to inputs 31, 32 ... 36 of the simulation circuit, an initialization signal in it of logic level 1 supplied by the generator according to the invention is applied to the inputs of multiplexers 40, 44, 48. This logic level 1 again appears on the corresponding outputs of the multiplexers and is applied to the input D of flip-flops 24, 25, 30. All the D flip-flops then store the logic level 1 at the first clock pulse CKS supplied at the same time as the INIT signal. The Q outputs 22, 23, 29 of flip-flops 24, 25, 30 then respectively supply logic level 1 signals. The signal appearing at the output 14 of the simulation circuit then has logic level 1. Inputs 31, 32, 36 of the simulation circuit are connected, as will be shown hereinafter, to the outputs of the sequence generator according to the invention. When the simulation circuit has been initialized in the manner indicated hereinbefore, if the sequence generator e.g. supplies an EVEN3 signal of logic level 1 to the input 34 of the simulation circuit at the same time as a clock pulse CKS, the flip-flop 25 corresponding to valve 2 of the simulated system supplies at its output 23 a logic level 0 signal, representing the failure of valve 2. By successively supplying the EVEN1, EVEN2 ... EVEN6 signals to the corresponding inputs of the simulation circuit, at successive instants $t_i$ determined by the clock of the generator according to the invention, there is a simulation of the succession of corresponding events (failures or satisfactory operation), which can occur in the operation of the components of the simulated hydraulic circuit. By observing the logic level of the signal on the output 14 of the simulation circuit and by knowing the sequence emitted at each instant $t_i$, it is consequently possible to determine the sequences leading to the failure or satisfactory operation of the simulated hydraulic circuit.

Thus, for example, in the system according to FIG. 1, failure can be brought about at the end of a sequence of events which can be as follows:
failure of valve 1,
repair of satisfactory operation of valve 1,
failure of valve 2,
failure of valve 1.

For the simulation circuit, this sequence corresponds to the application of an EVEN1 signal of logic level 1 to input 32 at instant $t_i$, then the application of an EVEN2 signal of logic level 1 to input 31 at instant $t_i+1$, then the application of an EVEN3 signal of logic level 1 to input 34 at time $t_i+2$ and finally the application of an EVEN1 signal of logic level 1 to the input 32 at instant $t_i+3$.

The failure of the system can also be obtained by valve 3 only failing. In this case, the sequence is quite simply constituted by the application of a logic level 1 EVEN5 signal to the input 36 of the simulation circuit at a single time $t_i$.

The simulation circuit represented in this drawing also comprises identical logic assemblies 50, 51, 52, in which only logic assembly 50 has been shown in detail. These logic assemblies are connected to the inputs of an OR gate 53. At its output 54, this gate supplies an in INVAL COMB signal, which is applied to the sequence generator according to the invention, when a sequence is not to be taken into account as a result of the non-observance of certain criteria. Thus, for example, in the simulation circuit described hereinbefore, an INVAL COMB signal of logic level 1 appears at the output 54 of OR gate 53, when a logic level 1 signal is applied to a failure input of a component (e.g. EVEN1, EVEN3 or EVEN5), and the component has already been considered as defective. In the same way, the INVAL COMB signal is brought to logic level 1, if a level 1 signal is applied to an input (EVEN1, EVEN2 or EVEN6), when the corresponding component has already been considered as being in a satisfactory operating state, the memory recording this state already having its output at logic level 1. The INVAL COMB signal is applied to the corresponding input of the generator according to the invention, as will be shown hereinafter.

Logic assembly 50 comprises an AND gate 55, whose inputs are respectively connected to the simulation input 32 and to the outputs 22 of flip-flop 24. The output of AND gate 55 is connected to an input of OR gate 53. This assembly also comprises an inverter 56, whose input is connected to the output of flip-flop 24 and whose output is connected to one input of an AND gate 57. Another input of the latter is connected to the simulation input 32. The output of AND gate 57 is connected to another input of OR gate 53. The assembly 51 and 52 are constructed in the same way. The drawing shows their inputs connected to the corresponding circuits 11, 12 and their outputs connected to inputs of OR gate 53.

Figures 3A, 3B:
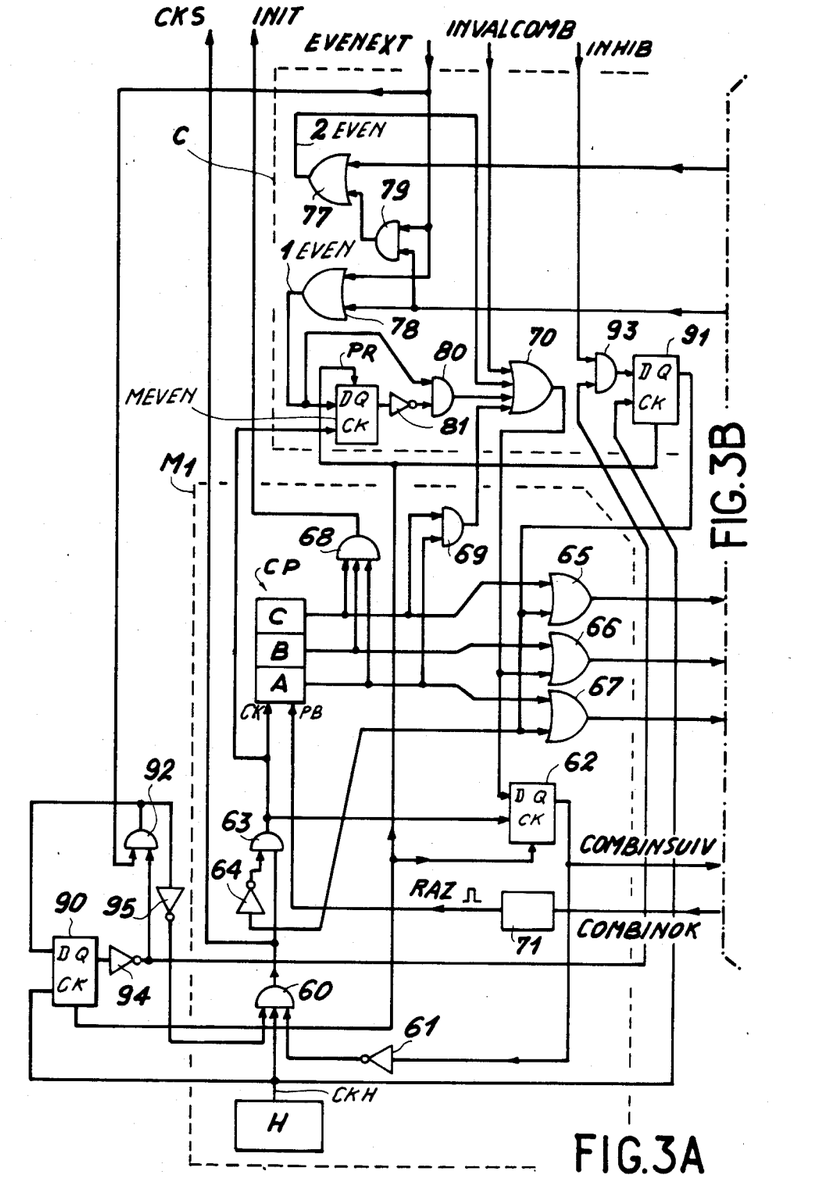
FIGS. 3A and 3B diagrammatically, a combined logic signal sequence generator according to the invention.
Figure 3B:
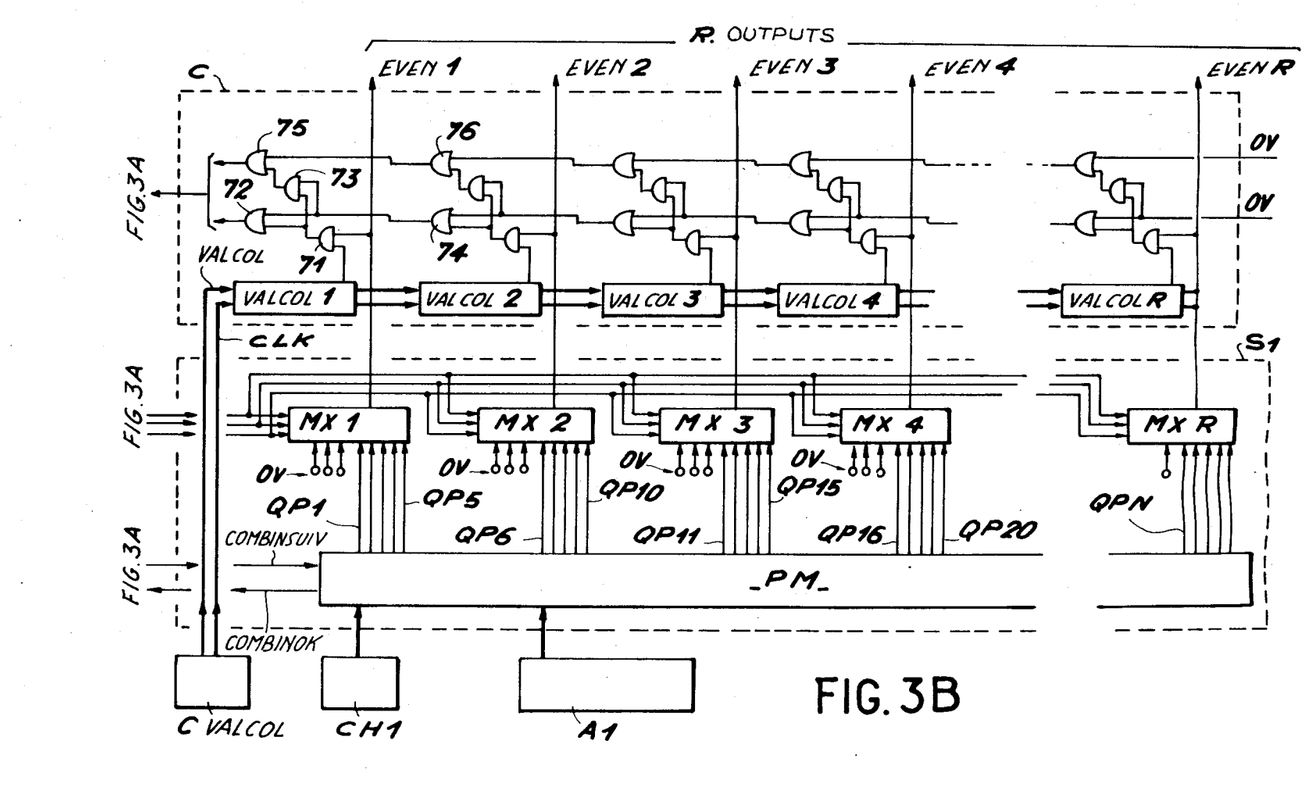

FIGS. 3a and 3b diagrammatically show a generator of a predetermined sequence of combined logic signals according to the invention. This generator has sequential means S1 having a number R of outputs EVEN1, EVEN2, EVEN3 . . . EVENR, said means being able to supply at each instant $t_i$ of a succession of instants and for each predetermined sequence of combined signals, a number $q_i$ of logic level 1 signals supplied on $q_i$ outputs and a number R-$q_i$ of logic level 0 signals supplied on R-$q_i$ outputs. The sum of the numbers $q_i$ is equal to a predetermined number p of logic level 1 signals in an initial combination recorded in said sequential means, as will be shown hereinafter. This initial combination corresponds to the predetermined sequence which it is wished to obtain and comprises p logic level 1 signals, as well as logic level 0 signals. In general terms, and as will be shown hereinafter, the number of successive instants $t_i$ varies from 1 to m, m being an integer equal to or below p, whilst $q_i$ is an integral value between 1 and p.

The following table provides a better understanding with respect to a particular example of the obtaining of a predetermined sequence on the outputs of the sequence generator according to the invention.

| $t_i$ | EVEN1 | EVEN2 | EVEN3 | EVEN4 | $q_i$ |
|---|---|---|---|---|---|
| $t_1$ | 1 | 0 | 0 | 0 | $q_1 = 1$ |
| $t_2$ | 0 | 0 | 1 | 0 | $q_2 = 1$ |
| $t_3$ | 1 | 1 | 1 | 0 | $q_3 = 3$ |

This table shows the logic levels 1 or 0 of the signals supplied on the outputs EVEN1, EVEN2, EVEN3, EVEN4 of the generator, at the successive instants $t_i$ ($t_1$, $t_2$, $t_3$), when i has the successive values 1, 2, 3. The values of $q_1$, $q_2$, $q_3$ are also indicated and show for each instant $t_i$, the number of outputs of the sequence generator which are at a level 1.

It is pointed out that in the predetermined sequence chosen in an exemplified manner, the number of logic signals of level 1 is $q_i=1$ at instant $t_1$, $q_2=1$ at instant $t_2$ and $q_3=3$ at instant $t_3$. The sum $q_1+q_2=q_3$ of values $q_i$ is equal to 5. The value p=5 corresponds to a chosen predetermined number p of logic level 1 signals. These p signals of level 1 are taken in an initial combination of N signals including, as will be shown hereinafter, N-p logic level 0 signals and p logic level 1 signals simultaneously supplied and not in sequence, said initial combination of logic signals being recorded, as will be shown hereinafter, in the sequential means of the generator according to the invention.

This generator also comprises means CH1, VAL-COL connected to the sequential means S1 for initializing said sequential means and so that they supply the logic level 1 and zero signals at the successive times $t_i$ corresponding to the predetermined sequence, on the basis of the initial combination recorded in the sequential means. These initialization means will be so described in greater detail hereinafter.

The generator also comprises control means M1 connected to the sequential means S1, so that at the successive instants $t_i$, the latter supply on the R outputs EVEN1, EVEN2 . . . EVENR, the $q_i$ logic level 1 signals and the R-$q_i$ logic level 0 signals. The sum of the numbers $q_i$, for all the instant $t_i$ of the sequence is equal to p and is fixed by the initial combination of signals applied to the sequential means. It is obvious that the aforementioned numbers R, $q_i$ and p are integers. Finally, the generator comprises stop means A1 connected to the sequential means S1, in order to stop the supply of signals on the R outputs of the generator according to the invention, following a predetermined sequence of combined signals.

The sequential means S1 comprise a combined logic signal generator PM having N outputs able to supply the initial combinations (p signals of level 1 and N-p signals of level 0) corresponding to the predetermined sequences which it is wished to obtain. The p outputs of said generator are represented at QP1 ... QPn. Each initial combination is formed from p logic level 1 signals produced on p outputs of the generator and N-p logic level 0 signals produced on N-p outputs of said generator. The generator PM able to supply the initial signal combinations is, for example, that described in French Patent Application No. 8,101,392, filed on Jan. 26th 1981, in the name of the present Applicant. The means A1 making it possible to stop the sequential means and which are connected to a said generator are e.g. those described in the aforementioned patent application. Means CH1, connected to the generator and which make it possible to initialize the sequential means, are e.g. those described in the aforementioned patent application. The means CVALCOL connected to means CH1 and which also make it possible to initialize the sequential means will be described in greater detail hereinafter.

The sequential means S1 also comprise multiplexers MX1, MX2 ... MXT, which simultaneously receive on N of their inputs, the p signals of logic level 1 and the N-p signals of logic level 0 corresponding to the initial combinations. These multiplexers supply on R outputs, the $q_i$ logic level 1 signals and the $R-q_i$ logic level 0 signals, at a certain number of successive instants $t_i$ of each sequence. The control means M1 are connected to the combined signal generator PN and to the multiplexer MX1 ... MXR.

The number of successive instants $t_i$ varies between 1 and m, m being an integer equal to or below p. Thus, in a sequence having p logic level 1 signals and for which a single logic level 1 signal is supplied at each instant $t_i$, a number p of instants $t_i$ will be necessary for describing a complete sequence having p logic level 1 signals.

The sequence generator according to the invention also comprises logic checking means C to be described in greater detail hereinafter. These checking means are connected to the R outputs of the multiplexers, as well as to the command means M1. They make it possible to abort any sequence for which at any instant $t_i$, two outputs signal from among the R signals supplied by the multiplexers are simultaneously at logic level 1, when they should not be in the simulation which it is wished to carry out. These checking means also make it possible to abort any sequence for which, at any instant ti, no logic level 1 signal is supplied on any random 1 of the R outputs of the multiplexers, whereas logic level 1 signals are supplied at an instant $t_{i+k}$, with $k \geq 1$.

The structure of these checking means, together with their operation, will be described in greater detail hereinafter. These means more particularly incorporate an INVALCOMB invalidation control input, via control means M1, of an initial combination of logic signals present on the N outputs of the combined logic signal generator PM. This input can be connected to the corresponding output of the simulation circuit of FIG. 1.

The logic checking means C also comprise EVENEXT and INHIB inputs which, as a function of the needs of the simulation to be carried out and as will be shown hereinafter, receive signals making it possible to stop or not stop the presentation of a combination of signals on the outputs of the sequential generator. These checking means also incorporate a VALCOL input, connected to said signal recording means and which, combined with the signals supplied by the multiplexers, make it possible to invalidate any sequence not corresponding to a desired sequence. This possibility will be described hereinafter.

The control means M1 supply the aforementioned simulation circuit with clock signals CKS and initialization signals in it under conditions to be consequently described. These control means also supply generator PM with a COMBINSUIV signal, when a predetermined signal sequence has been described and generator PM must have the following initial combination making it possible to describe another predetermined sequence. These control means M1 receive from generator PM, a COMBINOK signal, when a new initial combination making it possible to describe a predetermined sequence is present on the outputs QP1 ... QPN of the initial combination generator PM.

The structure and operation of the essential means of the generator according to the invention will now be described in greater detail.

The control means M1 comprise a clock H supplying pulses CKH to the input of an AND gate 60, which is connected by another input to the output of an inverter 61. The input of the latter is connected to the output Q of a monostable flip-flop 62, whose function will be described hereinafter and which in particular supplies the COMBINSUIV signal applied to generator PM. The output of gate 60 supplies clock pulses CKS to the aforementioned simulation circuit. This output is also connected to an input of an AND gate 63, whereof another input is connected to the output of an inverter 64. The output of AND gate 63 is connected to a clock input CK of a counter CP having three bits, in order to supply the clock pulses CKS thereto. The counter flip-flops are designated A, B, C. The output of AND gate 63 is also connected to a clock input CK of flip-flop 62, as well as to a clock input CK of a memory MEVEN, constituted by a D flip-flop. The outputs of counter cP are connected to multiplexers MX1, MX2 ... MXR, so that the latter has on one or more of its output EVEN1, EVEN2 ... EVENR, one or more of the signals present on their input QP* ... QPN. The outputs of counter CP are connected to the multiplexers via OR gates 65, 66, 67, which can also receive the inhibition signal INHIB on another input. The outputs of counter CP are also connected to the inputs of an AND gate 68, whose output supplies the initialization signal in it applied to the aforementioned simulation circuit. Finally, the first and last outputs of counter CP are connected to the inputs of an AND gate 69, whereof the output is connected to an input of an OR gate 70 of checking means C. The control means M1 also comprise a monostable flip-flop 71, whose input receives the COMBINOK signal from generator PM when a predetermined initial combination is present on the outputs of said combination generator PM. The output of this monostable flip-flop supplies, as will be shown hereinafter, a pulse RAZ for the resetting of counter CP and for the control of flip-flop 62, which then supplies the COMBINSUIV signal applied to generator PM, so that the latter has at its outputs a new initial combination of logic signals.

The output of the OR gate 70 of checking means C is connected to the input D of flip-flop 62.

Checking means C comprise shift registers VALCOL1, VOLCOL2 ... VALCOLR connected in series and loaded on initializing the logic signal sequence generator. The vALCOL inputs of these registers are loaded with signals from the initialization means C VALCOL, under the control of the shift pulses CLK. As will be shown hereinafter, these registers make it possible to validate the output signals of the multiplexers as a function of the simulation to be carried out, or to invalidate certain sequences which do not correspond to the desired sequences. Each register, such as e.g. register VALCOLI, comprises an output connected to an input of an AND gate 71, whereof another input is connected to the output of the corresponding multiplexer MX1 of the sequential means. The output of AND gate 71 is connected on the one hand to an input of an OR gate 72 and on the other hand to an input of an AND gate 73. Another input of AND gate 72 and another input of AND gate 73 are connected to the outputs of an OR gate 74 similar for the VALCOL 2 register to OR gate 72. The output of OR gate 73 connected to an input of an OR gate 75, whereof another input is connected to the output of an OR gate 76, similar for register VALCOL 2 to OR gate 74. The output of OR gate 75 is connected to an input of an OR gate 77. Gates 71, 72, 73, 75 form a logic assembly, whose function will be described hereinafter and which receives signals from multiplexer MX1, the corresponding shift register VALCOL 1, together with signals from the preceding logic assembly, corresponding to the shift register VALCOL 2 and to multiplexer MX2. The last assembly, not shown in the drawing and which corresponds to the penultimate multiplexer MX(R-1) and to the penultimate shift register VALCOL (R-1) receives on the inputs of the OR gates corresponding to OR gates 72, 75 and on the input of the AND gate corresponding to gate 73 of the first assembly, logic level 0 signals, as shown in the drawing.

The output of the OR gate 72 is connected to an input of an OR gate 78. Another input of gate 78 can receive, under conditions to be defined hereinafter, the EVENEXT signal. This signal can also be applied to one input of an AND gate 79, whose output is connected to another input of OR gate 77. Another input of AND gate 79 is connected to the output of the OR gate 72. The output of AND gate 77 is connected to an input of OR gate 70. The output of OR gate 78 is connected on the one hand to the input D of flip-flop MEVEN and on the other hand to an input of an AND gate 80. Another input of gate 80 is connected to the output of an inverter 81. The input of the latter is connected to the output Q of the MEVEN flip-flop. The output of AND gate 80 is connected to an input of OR gate 70.

The following explanations will now provide a better understanding of the operation of the combined logic signal sequence generator described hereinbefore.

When the initial combination generator PM has emitted initial combinations consisting of P logic level 1 signals and N-p logic level 0 signals on its N outputs QP1 ... QPN, it emits a COMBINOK signal, which is applied to the monostable flip-flop 71. The latter supplies a pulse bringing to logic level 1 the three flip-flops A, B, C of counter CP. Thus, the AND gate 68 supplies an INIT signal of logic level 1 which is applied, as described hereinbefore, to the simulation circuit for the initialization thereof. Up to this instant, no EVEN1, ... EVENR signal is supplied to the outputs of multiplexers MX1 ... MXR. This inhibition of the outputs of the multiplexers is due to the fact that the output signals of the counter applied to the control inputs (0, 1, 2 ... 6, 7) of the multiplexers, via OR gates 65, 66, 67 are all at logic level 1. In this case, it is input $O_V$ of each multiplexer which is selected, because input 7 of the multiplexer receives a logic level 0 signal.

When the first pulse CK of clock H is produced at instant $t_0$ (for $i=0$), the rising front of this pulse brings about the initialization of the simulation circuit, because the INIT signal is at logic level 1 (the 3 inputs of AND gate 68 being at logic level 1).

For the following clock pulse CKS, i.e. at time $t_1$ ($i=1$), the flip-flops A, B, C of the counter have at their outputs logic level 0 signals, which control the multiplexers so that the latter supply on outputs EVEN1 ... EVENR, signals respectively corresponding to the signals applied to inputs QP5, QP10, QP15 ... QPN of said multiplexers, because the input 0 of each multiplexer is selected. Thus, it is obvious that any other counting mode associated with any other way of controlling the multiplexers can be envisaged.

At the following clock pulse (corresponding to time $t_2$ for $i=2$), the output signal of flip-flop A of the counter is at logic level 1, whilst the output signal of flip-flops B and C are at logic level 0. The logic multiplexers will then supply on their outputs EVEN1 ... EVENR signals corresponding to the signals applied to their inputs QP4, QP9, QP14 .... QPN-1 by the initial combination generator PM.

Following the time $t_5$ (the considered embodiment having multiplexers with 5 inputs), flip-flop 62 is actuated by a new clock pulse. Thus, at time $t_5$, the output signals of the counter flip-flops A and C are at logic level 1 and consequently the output of the AND gate 69 is also at logic level 1. This logic level 1 is transmitted to flip-flop 62 via OR gate 70. A COMBINSUIV signal of logic level 1 consequently appears at the output of flip-flop 62. This signal is applied to the combination generator PM which then supplies, on its outputs, the following initial combination. The sequence generator will then supply a new predetermined sequence of signals on the basis of this new initial combination. When generator PM is ready to supply a new initial combination, a COMBINOK signal is applied to monostable flip-flop 71. The output signal of the latter resets flip-flop 62, whose output was at 1 at the end of the preceding sequence.

It should be noted that when at the end of a sequence, the output signal of flip-flop 62 passes to logic level 1, clock H is blocked because the input of AND gate 60, which is connected to the output of inverter 61, is at logic level 0.

A numerical example will provide a better understanding of the sequential operation of the generator according to the invention. For example, it is assumed that the combination generator PM supplies the initial combination of signals QP3=1, QP10=1, QP14=1, QP19=1 on 4 of its outputs, the signals on the other outputs of the generator being at logic level 0. On the basis of this combination, the sequential generator will e.g. supply on outputs EVEN1, EVEN2, EVEN3, EVEN4, the following predetermined sequential signals: the EVEN1 signal corresponding to signal QP3 of logic level 1 is supplied at time $t_3$. The EVEN2 signal corresponding to signal QP10 of logic level 1 is supplied at time $t_1$. The EVEN3 signal corresponding to QP14 of logic level 1 is supplied at time $t_2$. The EVEN4 signal corresponding to signal QP19 or logic level 1 is supplies at time $t_2$.

This example provides a better understanding of how a predetermined sequence of signals supplied at successive instants $t_i$ on the outputs of the sequential generator corresponds to an initial given combination of logic level 1 signals and logic level 0 signals supplied on outputs QP1 . . . QPN of combination generator PM.

The initialization means CH1 are the same as those described in the aforementioned French Patent application No. 8,101,392. These means are associated with the VALCOL initialization means making it possible, as will be shown hereinafter, to invalidate certain sequences on the outputs of the multiplexers. The stop means A1 are identical to those described in application No. 8,101,392.

A description will now be given of the means making it possible to invalidate a sequence not corresponding to a desired signal sequence on the outputs of the multiplexers. The group of registers VALCOL1 . . . VALCOLR makes it possible to record the same number of bits as there are multiplexers. Each bit which is at 1 in one of the registers VALCOL 1 . . . VALCOL N makes it possible to validate an output signal EVEN1 or EVEN2 . . . or EVENR corresponding thereto. The output designated 1 EVEN of OR gate 78 is at logic level 1, if there is at least one signal EVEN1 or EVEN2 . . . or EVENR of logic level 1, at the same time as a bit of value 1 in a corresponding register VALCOL 1 or VALCOL 2 or VALCOLR.

The output 2 EVEN of OR gate 77 is at logic level 1, if there are at least two outputs EVEN1, EVEN2 or EVENR at logic level 1 and bits of value 1 are in two of the registers VALCOL1 . . . VALCOLN corresponding to the two multiplexers, whose outputs are at logic level 1.

The two EVEN output of gate 77 makes it possible to invalidate a sequence in which two outputs of the sequential generator are at logic level 1, when they should not be for the desired simulation. In this case, the output 2 EVEN is at logic level 1. The sequence taking place is aborted because input D of flip-flop 62 is then at level 1 and the COMBINSUIV signal on the output of said flip-flop passes to logic level 1. A new initial combination is then presented on the outputs of the generator P1.

The means described hereinbefore make it possible to prevent the simultaneous arrival of two events (two simultaneous logic levels 1 on two outputs of the sequential generator). In other simulation cases, these means can be inhibited so as to permit the simultaneous arrival of two events, as will be shown hereinafter.

The checking means C also comprise means for aborting any sequence in which, at an instant $t_i$, no logic level 1 signal would be supplied on any of the R outputs of the multiplexers, whereas logic level 1 signals are supplied at instant $t_i+k$. Thus, it would serve no purpose to describe a sequence in which a clock pulse would not bring about any event on all the outputs of the sequential generator (all the outputs EVEN1 . . . EVENR are at logic level 0). Thus, for example, a sequence making it possible to obtain the INIT sitnal at the first clock pulse and then the EVEN1 and EVEN3 signals of logic level 1 for the second and third clock pulses, is equivalent to the sequence making it possible to obtain the INIT signal at the first clock pulse and then the EVEN1 signal (logic level 1) at the second clock pulse, no signal at the third clock pulse and the EVEN3 signal (logic level 1) for the fourth clock pulse. The second sequence given is equivalent to the first, but no event occurs at the third clock pulse. This sequence has a useless loss of time at the third clock pulse. The means making it possible to abort this type of sequence essentially comprise the MEVEN memory. The latter is initialized at its input PR, at logic level 1, during the appearance of the COMBINOK signal. As soon as there is an absence of events (logic level 0 signals on all the outputs EVEN1 . . . EVENR of the sequential generator for a clock pulse), the MEVEN memory passes to logic level 0. Thus, in this case, the output signal of the OR gate 78 is at logic level 0. If, following this absence of an event, an event occurs, the signal 1 EVEN is at logic level 1. The absence of event (output signal of the MEVEN flip-flop at logic level 0) is detected by the AND gate 80, which applies, via OR gate 70, a logic level 1 signal to input D of flip-flop 62. The output Q of said flip-flop 62 then passes to level 1, blocks clock H via inverter 61 and also the AND gate 60. The sequence taking place is stopped, the COMBINSUIV signal of logic level 1 controls the combination generator PM, so that the latter supplies a new initial combination.

The checking means C comprise an INVALCOMB input for the invalidation control of an initial combination of logic signals present on the outputs of generator PM. This logic level 1 signal can be applied to the sequential generator by the aforementioned simulation circuit, when the sequence does not satisfy certain predetermined criteria. The INVALCOMB signal is applied to flip-flop 62 via OR gate 70. The output of this flip-flop, which is then at logic level 1, blocks clock H and controls generator PM, so that the latter supplies another initial combination at its output.

As a function of the requirements of the simulation to be performed, the EVENEXT input makes it possible to stop or not stop the presentation of a combination of signals on the outputs of the sequential generator, in relation to a signal present on the INHIB input. The INHIB and EVENEXT inputs are connected to logic circuits, whereof the connections will not be described in detail. These circuits comprise D flip-flops 90, 91, AND gates 92, 93 and inverters 94, 95.

When a logic level 1 signal is applied to the EVENEXT input, there is on the one hand 1 EVEN signals and possibly 2 EVEN signals ond on the other hand it blocks the transmission of clock signals CKH to the simulation circuit (signal CKS) and to the sequential generator (signal CK), via gates 92, 60 and inverter 95, the D flip-flop 90 initially being at logic level 0.

Simultaneously, a logic level 0 or 1 is applied to the INHIB input, depending on whether the simulation taking place does or does not require the application of signals supplied to the outputs of the sequential generator. The INHIB signal is stored by D flip-flops 91 at the following clock pulse CKH (not transmitted to the simulation circuit and to the sequential generator). This same pulse leads to a passage from logic level 0 to logic level 1 of D flip-flops 90, which then brings about the reappearance of clock signal CKS of the simulation circuit and of clock signal CK of the sequential generator. However, signal CK is only effectively validated if flip-flop 91 remains at logic level 0. The AND gate 93 permits the resetting of flip-flop 91 at the following clock pulse, because flip-flop 90 applies a logic level 1 signal to inverter 94, whose output is then at zero. The INHIB signal of logic level 1 is only used when the 1EVENEXT signal is itself at logic level 1.

Storage of the INHIB signal is necessary as a result of the fact that the INHIB signal is dependent on the signal supplied by the sequential generator and the presence of signals supplied for this generator is dependent on the presence of said INHIB signal. This storage prevents any oscillation due to the presence of such a relooping.

What is claimed is:

1. A generator of predetermined sequences of combined logic signals, wherein it comprises sequential means incorporating a number R of outputs able to supply at each instant $t_i$ of a succession of instants of each predetermined sequence of combined signals, a number $q_i$ of signals of logic level 1 supplied on $q_i$ outputs and a number $R-g_i$ of signals of logic level 0 supplied on $R-q_i$ outputs, the sum of the numbera $q_i$ being equal to a predetermined number p of signals of logic level 1, means connected to the sequential means for initializing them and in order that they supply the signals of logic levels 1 and 0 at the successive times $y_i$ corresponding to the predetermined sequence on the basis of the recorded initial combination, control means connected to the sequential means so that the latter supply at instants $t_i$ or R outputs, the $q_i$ signals of logic level 1 and the $R-q_i$ signals of logic level 0, so that the sum of the numbers $q_i$ is equal to p for all the instant $t_i$ in the sequence, the numbers R, $q_i$ and p being integers and stop means connected to a stopping input of the sequential means for stopping the supply of signals on the R outputs following a predetermined sequence of combined signals in response to said combined signals.

2. A combined logic signal sequence generator according to claim 1, wherein the sequential means are sequential multiplexing means able to record said initial combinations for supplying on R outputs, the $q_i$ signals of logic level 1 and the $R-q_i$ signals of logic level 0, each initial combination having p signals of logic level 1 and signals of logic level 0.

3. A combined logic signal sequence generator according to claim 2, wherein the sequential multiplexing means comprise a combined logic signal generator having N outputs able to supply said initial combinations, corresponding to said predetermined sequences, each initial combination being formed from p signals of logic level 1 produced on p outputs of the combined signal generator and N-p signals of logic level 0 produced on N-p outputs of the combined signal generator and multiplexers receiving on N outputs the p signals of logic level 1 and the N-p signals of logic level 0, corresponding to the initial combinations and supplying on R outputs, the $q_i$ signals of logic level 1 and the $R-q_i$ signals of logic level 0 at the successive instants $t_i$ of each sequence, the initialization means being connected to the combined signal generator, the control means being connected to the combined signal generator and to the multiplexers.

4. A combined logic signal sequence generator according to claim 3, wherein the number of successive instants $t_i$ varies from 1 to m, m being an integer equal to or lower than p, whilst $q_i$ is an integral value between 1 and p.

5. A combined logic signal sequence generator according to claim 3, wherein it also comprises logic checking means connected to the R outputs of the multiplexers and to the control means having for aborting any sequence for which, at any instant $t_i$, two output signals from among the R output signals of the multiplexers are simultaneously at logic level 1 when they should not be.

6. A combined logic signal sequence generator according to claim 5, wherein the checking means C have means for aborting any sequence for which, at any instant $t_i$, no signal of logic level 1 is supplied to any random 1 of the R outputs of the multiplexers at an instant $t_i$ of a sequence, whereas signals of logic level 1 are supplied at an instant $t_{i+k}$, with $k \leq 1$.

7. A combined logic signal sequence generator according to claim 6, wherein the logic checking means incorporates an input for the control of the invalidation by control means of an initial combination of logic signals present on the N outputs of the combined logic signal generator.

8. A combined logic signal sequence generator according to claim 7, wherein the logic checking means (C) also incorporates an input (EVENEXT) and an input (INHIB) for the control of bringing to logic level 0 of the output signals of the multiplexers, when at an instant $t_i$ the sequence of signals provided at this instant on the outputs of the multiplexers must not be used.

9. A combined logic signal sequence generator according to claim 1, wherein the checking means (C) incorporate means for the recording of signals (VALCOL), which, combined with the signal supplied on the R outputs of the multiplexers (MX1 ... MXR) make it possible to invalidate any sequence not corresponding to a desired signal sequence on the outputs of the multiplexers.

* * * * *